(12) United States Patent
Kim

(10) Patent No.: US 12,432,919 B2
(45) Date of Patent: Sep. 30, 2025

(54) SEMICONDUCTOR DEVICE AND METHOD FOR MANUFACTURING THE SEMICONDUCTOR DEVICE

(71) Applicant: SK hynix Inc., Icheon-si (KR)

(72) Inventor: Jae Ho Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 666 days.

(21) Appl. No.: 17/842,259

(22) Filed: Jun. 16, 2022

(65) Prior Publication Data
US 2023/0337427 A1 Oct. 19, 2023

(30) Foreign Application Priority Data
Apr. 18, 2022 (KR) ........................ 10-2022-0047605

(51) Int. Cl.
| H10B 43/27 | (2023.01) |
| H10B 41/10 | (2023.01) |
| H10B 41/27 | (2023.01) |
| H10B 43/10 | (2023.01) |

(52) U.S. Cl.
CPC ............ *H10B 43/27* (2023.02); *H10B 41/10* (2023.02); *H10B 41/27* (2023.02); *H10B 43/10* (2023.02)

(58) Field of Classification Search
CPC ........ H10B 41/10; H10B 41/27; H10B 41/30; H10B 41/40; H10B 41/50; H10B 43/10; H10B 43/27; H10B 43/30; H10B 43/40; H10B 43/50
See application file for complete search history.

(56) References Cited

U.S. PATENT DOCUMENTS

2020/0294850 A1* 9/2020 Lee .................. H10B 43/50
2021/0074726 A1* 3/2021 Lue .................. H10B 51/30

FOREIGN PATENT DOCUMENTS

| KR | 1020170072496 A | 6/2017 |
| KR | 1020210040475 A | 4/2021 |

* cited by examiner

*Primary Examiner* — Brook Kebede
(74) *Attorney, Agent, or Firm* — WILLIAM PARK AND ASSOCIATES LTD.

(57) ABSTRACT

A semiconductor device includes: a stack including a first plane edge region, a second plane edge region, and a contact region located between the first plane edge region and the second plane edge region; and a first insulating structure including a first portion located in the first plane edge region of the stack, a second portion located in the second plane edge region of the stack, and a third portion located in the contact region of the stack, wherein the first portion includes a first curved edge.

18 Claims, 25 Drawing Sheets

E - E'

SEMICONDUCTOR DEVICE AND METHOD FOR MANUFACTURING THE SEMICONDUCTOR DEVICE

CROSS-REFERENCE TO RELATED APPLICATION

This application claims priority under 35 U.S.C. § 119 to Korean Patent Application No. 10-2022-0047605 filed on Apr. 18, 2022, which is incorporated herein by reference in its entirety.

BACKGROUND

1. Technical Field

Embodiments relate to an electronic device, and more particularly, to a semiconductor device and a method for manufacturing the semiconductor device.

2. Related Art

The integration degree of a semiconductor device is mainly decided by an area occupied by a unit memory cell. Recently, as the improvement in integration degree of a semiconductor device having memory cells formed as a single layer on a substrate reaches the limit, a 3D semiconductor device having memory cells stacked on a substrate has been suggested. Furthermore, in order to improve the operation reliability of such a semiconductor device, various structures and manufacturing methods are being developed.

SUMMARY

In an embodiment, a semiconductor device may include: a stack including a first plane edge region, a second plane edge region, and a contact region located between the first plane edge region and the second plane edge region; and a first insulating structure including a first portion located in the first plane edge region of the stack, a second portion located in the second plane edge region of the stack, and a third portion located in the contact region of the stack, wherein the first portion includes a first curved edge.

In an embodiment, a semiconductor device may include: a stack including a first plane edge region, a second plane edge region, and a contact region located between the first plane edge region and the second plane edge region; and an insulating structure including a first portion located in the first plane edge region of the stack and having substantially a semicircular cylinder shape, a second portion located in the second plane edge region of the stack, and a third portion including a stair structure located in the contact region of the stack.

In an embodiment, a method for manufacturing a semiconductor device may include: forming a stack including a first plane edge region, a second plane edge region, and a contact region located between the first plane edge region and the second plane edge region; forming a trench including a first portion located in the first plane edge region of the stack, a second portion located in the second plane edge region of the stack, and a third portion located in the contact region of the stack, wherein the first portion includes a first curved edge; and forming a first insulating structure in the first trench.

In an embodiment, a method for manufacturing a semiconductor device may include: forming a stack including a first plane edge region, a second plane edge region, and a contact region located between the first plane edge region and the second plane edge region; forming a first trench in the contact region of the stack, the first trench defining a stair structure; forming a second trench including a first portion located in the first plane edge region of the stack and having substantially a semicircular cylinder shape, a second portion located in the second plane edge region of the stack, and a third portion which is located in the contact region of the stack and to which the stair structure is transferred; and forming an insulating structure in the second trench.

DETAILED DESCRIPTION

Various embodiments are directed to a semiconductor device having a stable structure and improved characteristics, and a method for manufacturing the semiconductor device.

In accordance with the present embodiments, memory cells may be stacked in a 3D manner to improve the integration degree of the semiconductor device. Furthermore, in an embodiment, it is possible to provide a semiconductor device having a stable structure and improved reliability.

Hereafter, embodiments according to the technical idea of the present disclosure will be described with reference to the accompanying drawings.

Figure 1A:
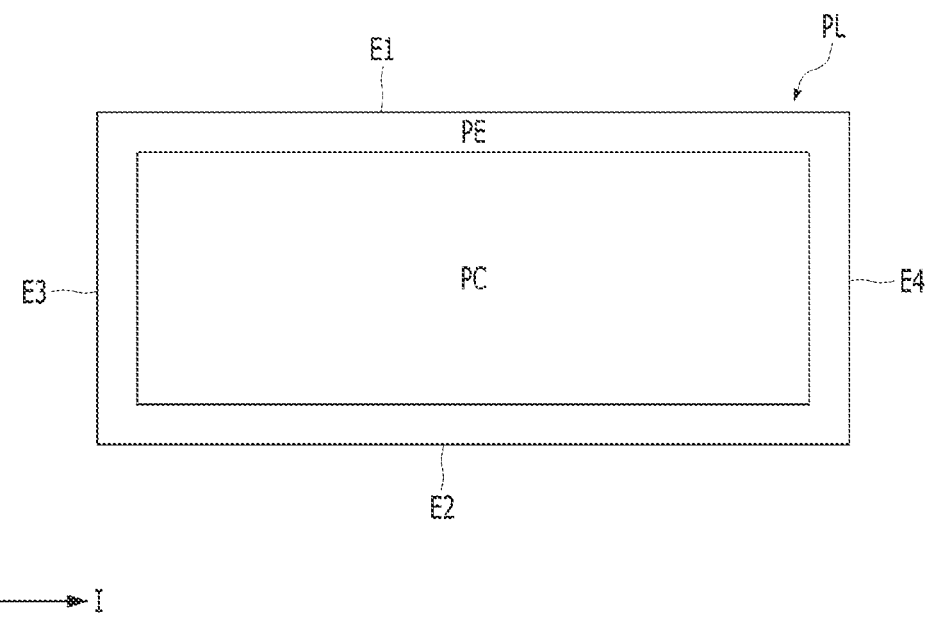
FIGS. 1A, 1B, and 1C are diagrams illustrating the structure of a semiconductor device in accordance with an embodiment.
Figure 1B:
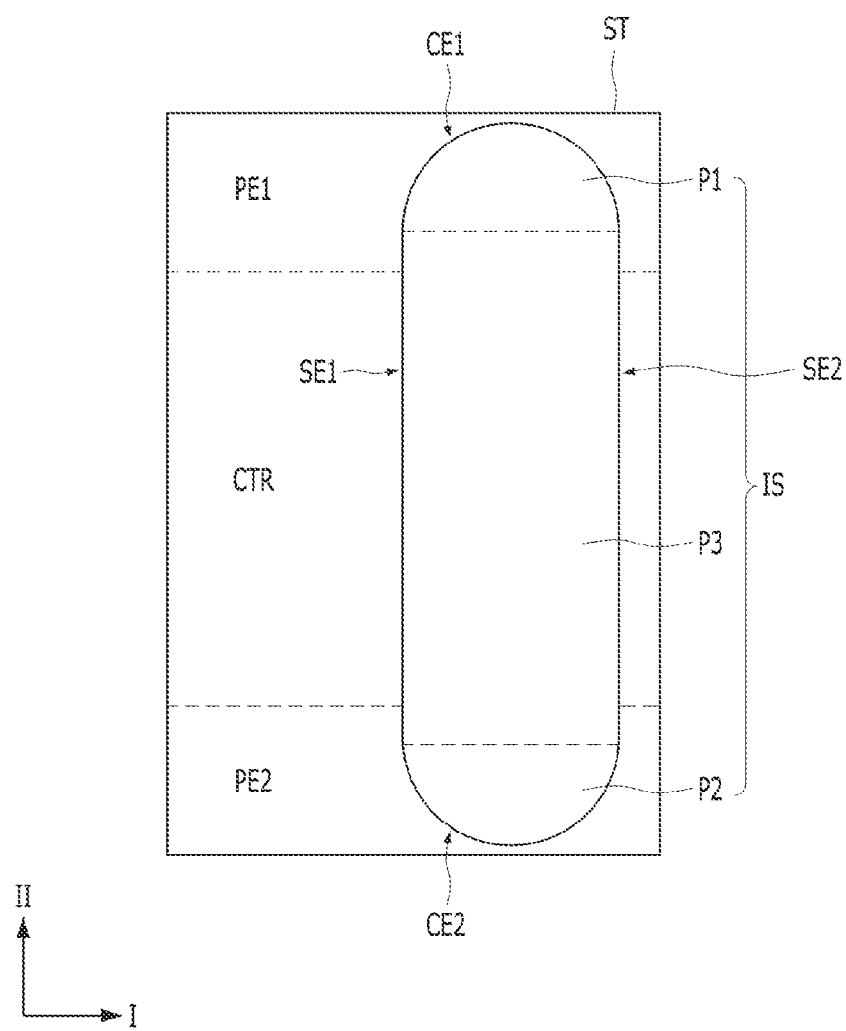
Figure 1C:
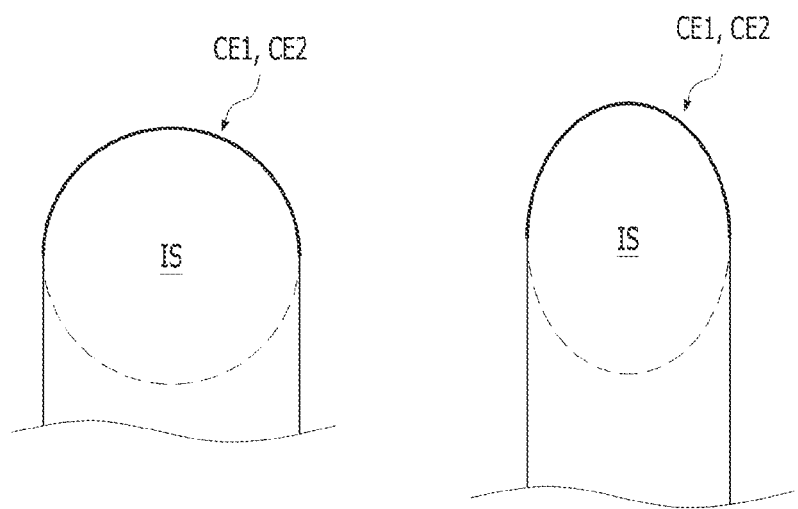

FIGS. 1A to 1C are diagrams illustrating the structure of a semiconductor device in accordance with an embodiment.

Referring to FIG. 1A, the semiconductor device may include a plane PL. The semiconductor device may include a plurality of planes PL. In an embodiment, the planes PL may be arranged in a first direction I, arranged in a second direction II crossing the first direction I, or arranged in the first direction I and the second direction I and II.

The plane PL may include memory blocks. The memory blocks may each include memory cells, and data may be erased on a memory block basis. The memory blocks may be arranged in the first direction I, arranged in the second direction II, or arranged in the first direction I and the second direction II, within the plane PL.

The plane PL may include a first edge E1, a second edge E2, a third edge E3, and a fourth edge E4. The first edge E1 and the second edge E2 may face each other, and the third edge E3 and the fourth edge E4 may face each other. Along the first to fourth edges E1 to E4 of the plane PL, plane edge regions PE each having a predetermined width may be defined. The plane edge regions PE may have a uniform width or different widths depending on the locations thereof. The plane edge regions PE may be continuously defined or discontinuously defined along the perimeter of the plane PL. The word "predetermined" as used herein with respect to a parameter, such as a predetermined width, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The other region of the plane PL except the plane edge regions PE may be a plane center region PC. The memory blocks may be located in the plane center region PC, and not located in the plane edge region.

Referring to FIGS. 1A and 1B, the semiconductor device may include a stack ST and an insulating structure IS. The stack ST may include first material layers and second material layers, which are alternately stacked. The stack ST may be located in the plane edge region PE and the plane center region PC.

The stack ST may include a first plane edge region PE1, a second plane edge region PE2, and a contact region CTR. The contact region CTR may be located between the first plane edge region PE1 and the second plane edge region PE2. The first plane edge region PE1 and the second plane edge region PE2 may correspond to the plane edge region PE, for example, shown in FIG. 1A. The contact region CTR may correspond to the plane center region PC, for example, shown in FIG. 1A. For example, the first plane edge region PE1 may correspond to first edge E1 and the second plane edge region PE2 may correspond to second edge E2 or vice versa. For example, the first plane edge region PE1 may correspond to third edge E3 and the second plane edge region PE2 may correspond to fourth edge E4 or vice versa.

The insulating structure IS may be located in the stack ST, and include a first portion P1, a second portion P2, and a third portion P3. The first portion P1 may be located in the first plane edge region PE1 of the stack ST. The second portion P2 may be located in the second plane edge region PE2 of the stack ST. The third portion P3 may be located in the contact region CTR of the stack ST.

The boundary between the first portion P1 and the third portion P3 may coincide with or differ from the boundary between the first plane edge region PE1 and the contact region CTR. In an embodiment, the boundary between the first portion P1 and the third portion P3 may be located in the first plane edge region PE1. The boundary between the second portion P2 and the third portion P3 may coincide with or differ from the boundary between the second plane edge region PE2 and the contact region CTR. In an embodiment, the boundary between the second portion P2 and the third portion P3 may be located in the second plane edge region PE2. For example, as shown in FIG. 1B, the third portion P3 may be located in the contact region CTR and at least one plane edge region PE.

The insulating structure IS may be extended in substantially the same direction as the direction in which the first plane edge region PE1 and the second plane edge region PE2 neighbor each other. In an embodiment, the first plane edge region PE1 and the second plane edge region PE2 may neighbor each other in the second direction II, and the insulating structure IS may be extended in the second direction II. Alternatively, the first plane edge region PE1 and the second plane edge region PE2 may neighbor each other in the first direction I, and the insulating structure IS may be extended in the first direction I.

The first portion P1 of the insulating structure IS may include a first curved edge CE1 on a plane defined in the first direction I and the second direction II. The second portion P2 of the insulating structure IS may include a second curved edge CE2 on the plane. Referring to FIG. 1C, the first curved edge CE1 or the second curved edge CE2 may be a portion of a circle or ellipse. In an embodiment, the first curved edge CE1 or the second curved edge CE2 may have a semicircular shape, in the plan view.

The third portion P3 of the insulating structure IS may include a first straight edge SE1 and a second straight edge SE2. The first straight edge SE1 and the second straight edge SE2 may be extended in the second direction II, while facing each other in the first direction I. The insulating structure IS may include both or only one of the first curved edge CE1 and the second curved edge CE2.

According to the above-described structure, an end portion of the insulating structure IS has a curved shape, in the plan view. Since stress is distributed by the curved shape, in an embodiment, the insulating structure IS may have a stable structure.

Figure 2A:
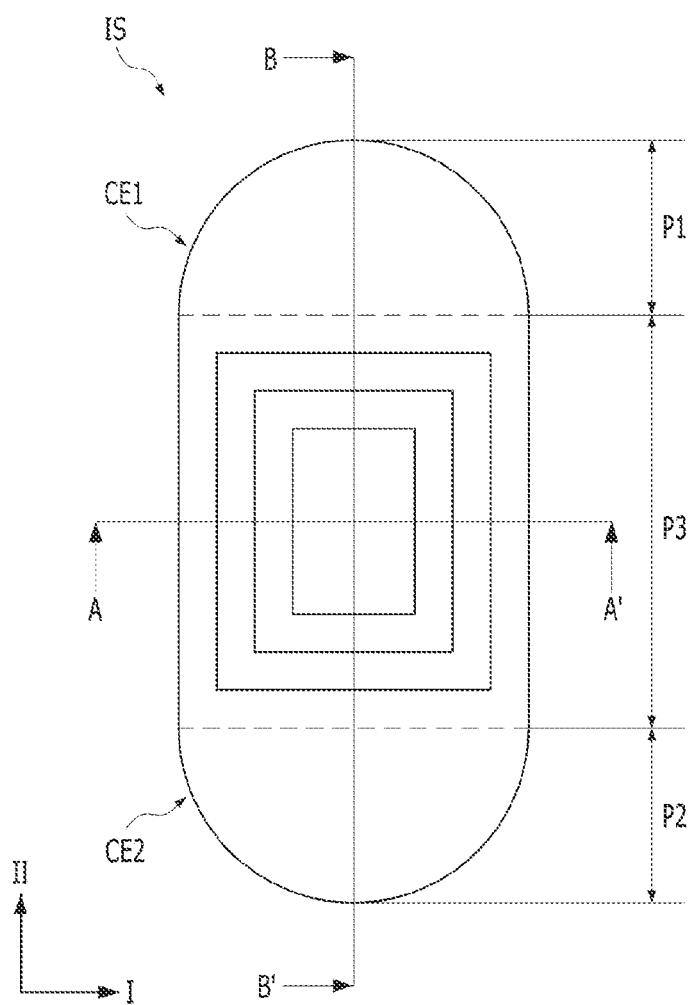
FIGS. 2A, 2B, 2C, and 2D are diagrams illustrating the structure of the semiconductor device in accordance with the embodiment.
Figure 2B:
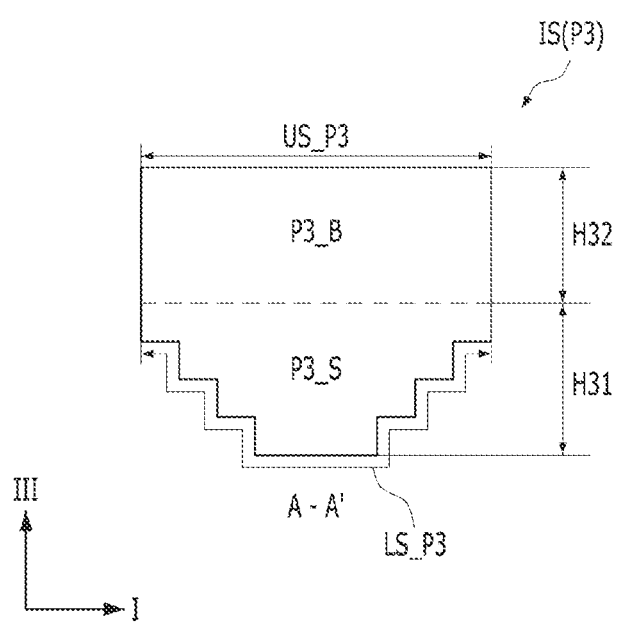
Figure 2C:
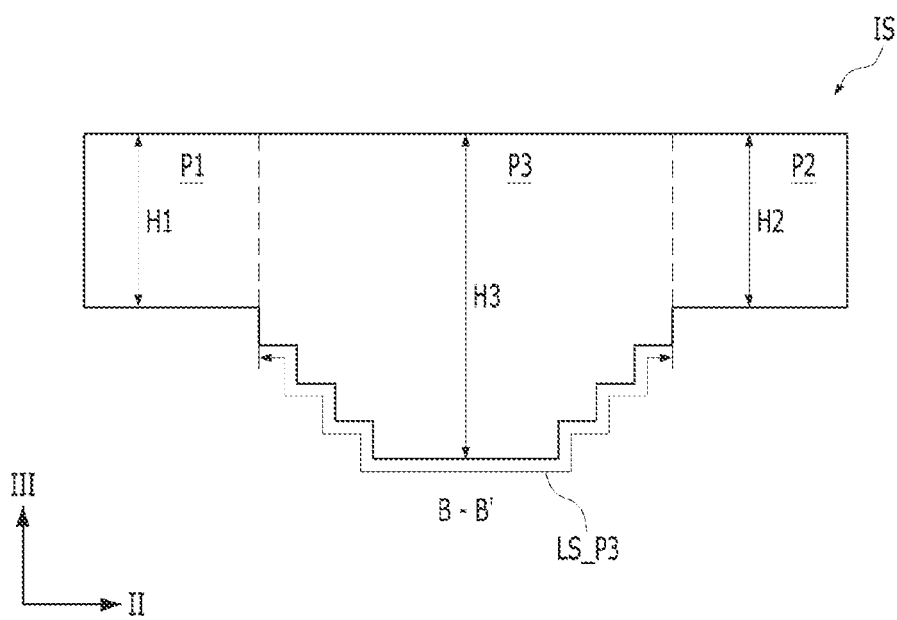
Figure 2D:
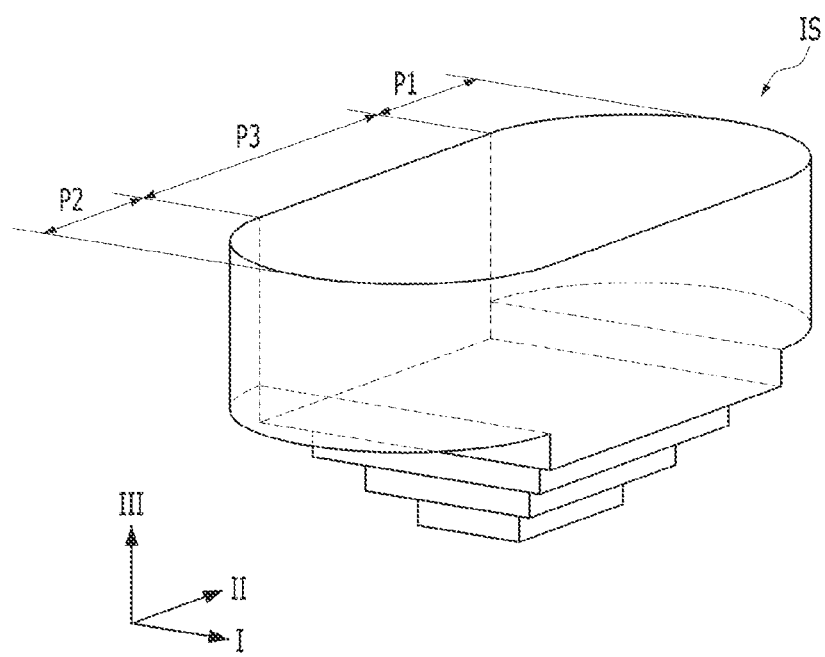

FIGS. 2A to 2D are diagrams illustrating the structure of the semiconductor device in accordance with the embodiment. FIG. 2A may be a plan view illustrating the layout of the insulating structure, FIG. 2B may be a cross-sectional view taken along line A-A' of FIG. 2A, and FIG. 2C may be a cross-sectional view taken along line B-B' of FIG. 2B. FIG. 2D may be a perspective view of the insulating structure. Hereafter, contents overlapping the above-described contents will be omitted.

Referring to FIGS. 2A to 2D, the insulating structure IS may include first to third portions P1 to P3. The insulating structure IS may have a height defined in a third direction III, and have different heights depending on portions thereof. The third direction III may be a direction that protrudes from a plane defined in the first direction I and the second direction II. In an embodiment, the third direction III may be orthogonal to the first direction I and the second direction II.

The first portion P1 may have a first height H1, the second portion P2 may have a second height H2, and the third portion P3 may have a third height H3. The third height H3 may be different from the first height H1 or the second height H2. In an embodiment, the third height H3 may be larger than the first height H1 or the second height H2. The first height H1 and the second height H2 may be substantially equal to each other or different from each other. Here, "substantially equal" indicates that two measured values are equal to each other, or belong to a range including process errors.

The insulating structure IS may include a stair structure in a portion thereof. The insulating structure IS may include the stair structure in the third portion P3, and include no stair structure in the first portion P1 and the second portion P2. The third portion P3 may include a body portion P3_B located between the first portion P1 and the second portion P2 and a stair portion P3_S including the stair structure. The body portion P3_B may have substantially the same height as or a different height from the stair portion P3_S. In an embodiment, a height H32 of the body portion P3_B may be larger than a height H31 of the stair portion P3_S. When the semiconductor device includes a plurality of insulating structures IS, the heights H31 of the stair portions P3_S of the plurality of insulating structures IS may be substantially equal to one another, and the heights H32 of the body portions P3_B of the plurality of insulating structures IS may be different from one another.

On a cross-section defined in the first direction I and third direction III or a cross-section defined in the second direction II and third direction III, a lower surface LS_P3 of the third portion P3 may have a stair shape. Due to the stair shape, the lower surface LS_P3 of the third portion P3 may have a shape protruding in the third direction III. An upper surface US_P3 of the third portion P3 may be located on substantially the same plane as an upper surface of the first portion P1 or an upper surface of the second portion P2.

For reference, the terms such as upper and lower are relative concepts, and the insulating structure IS may be located upside down. In an embodiment, the upper surface of the insulating structure IS may include a stair structure. In this case, a lower surface of the third portion P3 may be located on substantially the same plane as a lower surface of the first portion P1 or a lower surface of the second portion P2.

The first portion P1 of the insulating structure IS may be a portion of a cylinder. The second portion P2 of the insulating structure IS may be a portion of the cylinder. In an embodiment, the first portion P1 or the second portion P2 may have a semicircular cylinder shape. The second portion P2 may have a symmetrical or asymmetrical shape with respect to the first portion P1.

According to the above-described structure, the first portion P1 or the second portion P2 of the insulating structure IS may have a curved shape such as a circle or ellipse, and includes no angled edge. Therefore, in an embodiment, stress may be distributed by the curved shape, and the insulating structure IS may have a stable structure.

Figure 3A:
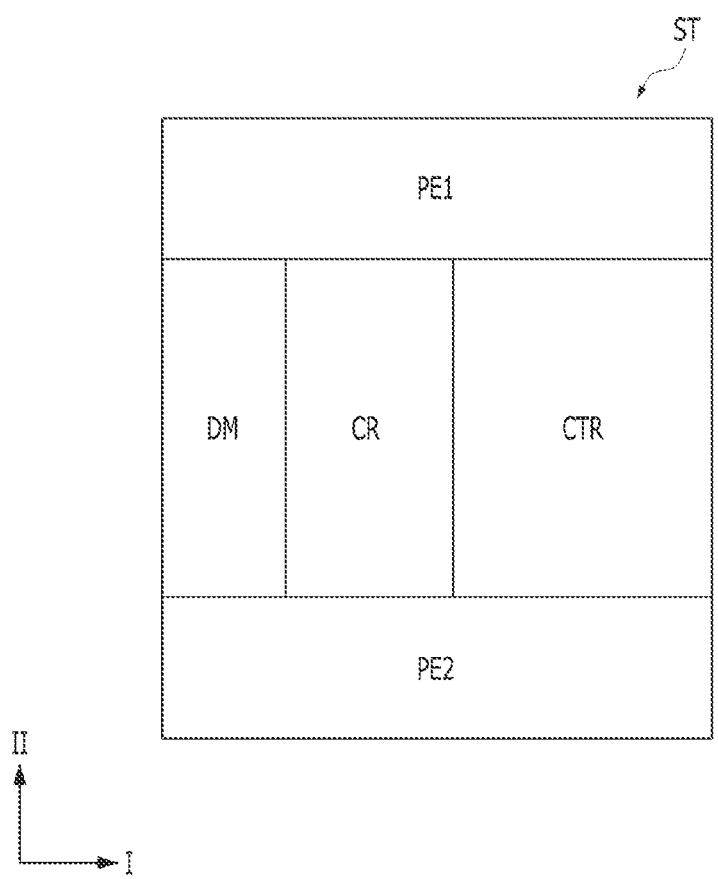
FIGS. 3A, 3B, and 3C are diagrams illustrating the structure of the semiconductor device in accordance with the embodiment.
Figure 3B:
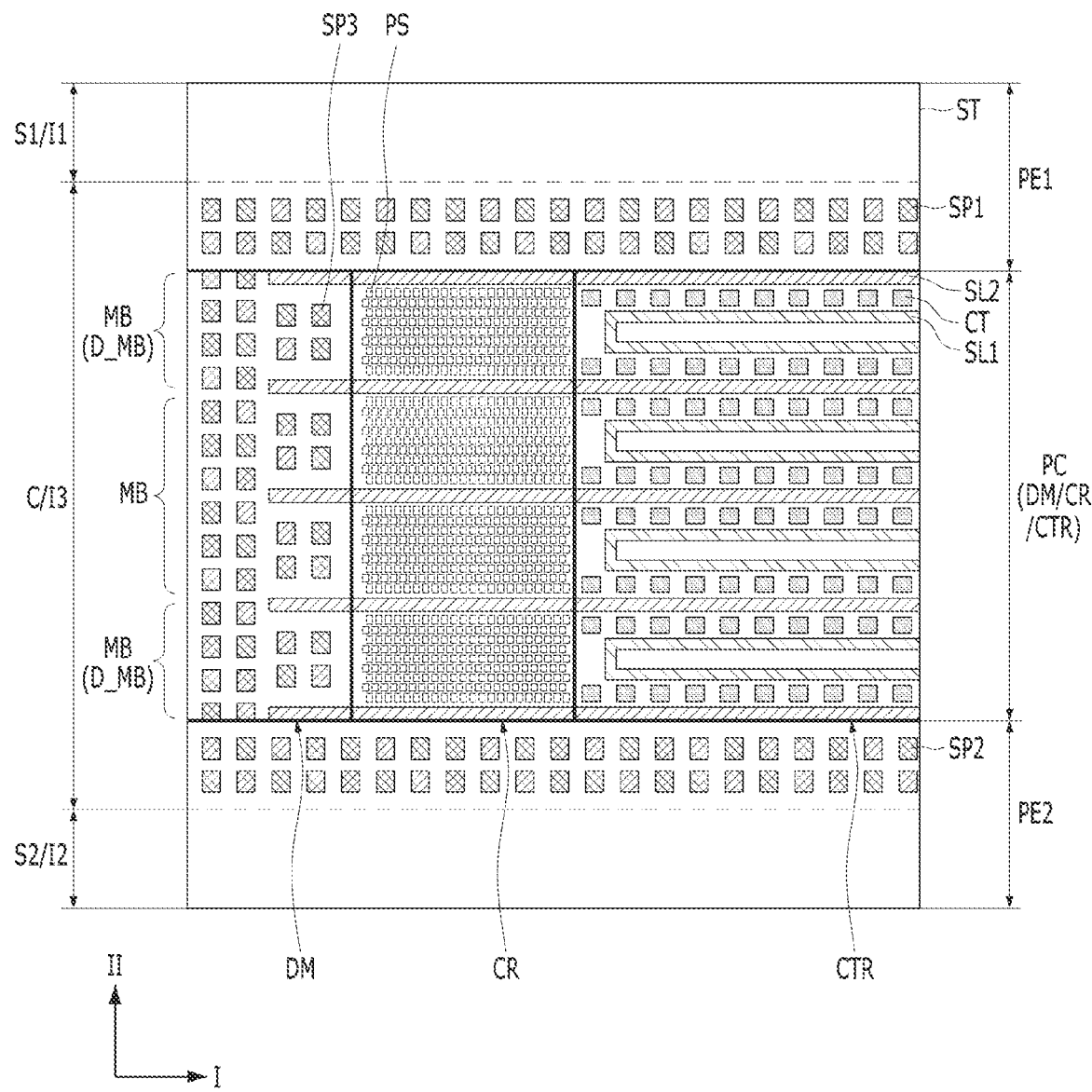
Figure 3C:
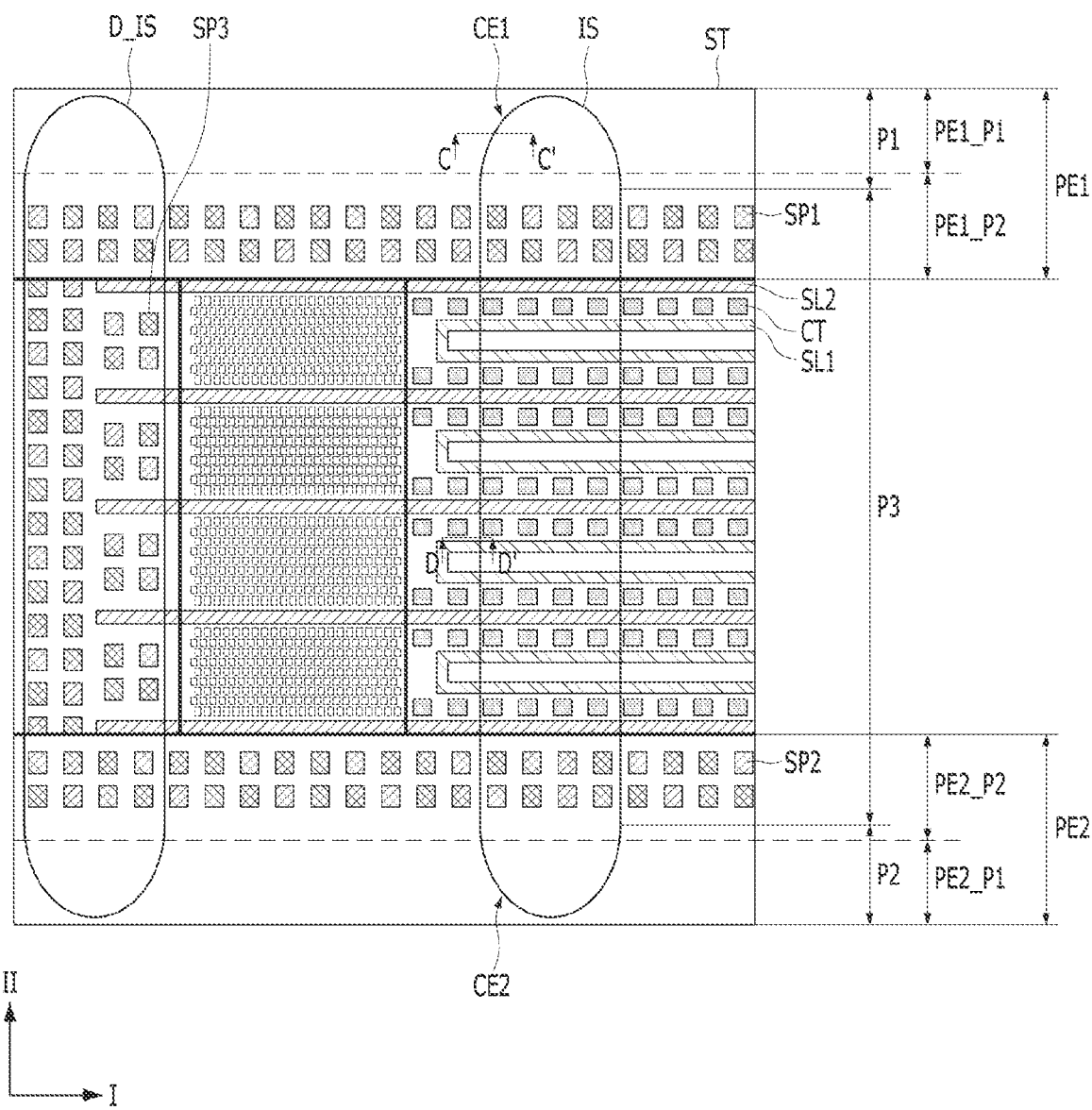

FIGS. 3A to 3C are diagrams illustrating the structure of the semiconductor device in accordance with the embodiment. FIGS. 3A to 3C are plan views illustrating the layout of the semiconductor device. Hereafter, contents overlapping the above-described contents will be omitted.

Referring to FIGS. 3A and 3B, the semiconductor device may include a stack ST, a penetrating structure PS, a first supporter SP1, a second supporter SP2, a third supporter SP3, a contact plug CT, a first or second slit structure SL1 or SL2, or include a combination thereof.

The stack ST may include a first plane edge region PE1 and a contact region CTR. The stack ST may further include a second plane edge region PE2 and a cell region CR or a dummy region DM, or further include a combination thereof. The cell region CR may be a region in which stacked memory cells are located. The contact region CTR may be a region in which interconnections and pads for bias application are located. The interconnections may include wiring lines, contact plugs and the like. The dummy region DM may be located adjacent to the cell region CR, and a supporter, a dummy structure and the like may be located in the dummy region DM.

The first plane edge region PE1 and the second plane edge region PE2 may face each other in the second direction II. Between the first plane edge region PE1 and the second plane edge region PE2, the cell region CR, the contact region CTR, or the dummy region DM may be located. The cell region CR and the contact region CTR or the dummy region DM may neighbor each other in the first direction I. In an embodiment, the cell region CR may be located between the dummy region DM and the contact region CTR.

The stack ST may have different shapes depending on portions thereof. The contact region CTR of the stack ST may include a stair structure. The first plane edge region PE1 may include no stair structure, or include a stair structure in only a portion thereof. The second plane edge region PE2 may include no stair structure, or include a stair structure in only a portion thereof. The cell region CR or the dummy region DM may include no stair structure.

The stack ST may include first material layers and second material layers, which are alternately stacked. The first material layers may include a conductive material or sacrificial material. The second material layers may include an insulating material. The sacrificial material may be a material which is not replaced with a conductive material but remains in a manufacturing process.

The first plane edge region PE1 of the stack ST may include first sacrificial layers S1 and first insulating layers I1, which are alternately stacked. The second plane edge region PE2 of the stack ST may include second sacrificial layers S2 and second insulating layers I2, which are alternately stacked. The cell region CR, the contact region CTR, or the dummy region DM of the stack ST may include conductive layers C and third insulating layers I3, which are alternately stacked. The first insulating layer I1, the second insulating layer I2, and the third insulating layer I3, which are located at substantially the same level, may be interconnected as a single layer.

For reference, a portion of the first plane edge region PE1 of the stack ST, adjacent to the second slit structure SL2, may include the conductive layers C instead of the first sacrificial layers S1. The conductive layers C of the dummy region DM may be extended up to a portion of the first plane edge region PE1, adjacent to the second slit structure SL2. A portion of the second plane edge region PE2 of the stack ST, adjacent to the second slit structure SL2, may include the conductive layers C instead of the second sacrificial layers S2. The conductive layers C of the dummy region DM may be extended to a portion of the second plane edge region PE2, adjacent to the second slit structure SL2.

The penetrating structure PS may penetrate the cell region CR of the stack ST. At the respective intersections between the conductive layers C and the penetrating structure PS, memory cells may be located. Along the penetrating structure PS, the memory cells may be stacked.

The contact plug CT may be electrically coupled to the contact region CTR of the stack ST. Through the stair structure located in the contact region CTR of the stack ST, the conductive layers may be exposed. The contact plugs CT may be connected to the exposed conductive layers, respectively. Thus, the contact plug CT may be electrically coupled to the conductive layers of the stack ST.

The first supporter SP1 may penetrate the first plane edge region PE1 of the stack ST. The second supporter SP2 may penetrate the second plane edge region PE1 of the stack ST. The first supporter SP1 or the second supporter SP2 may be located adjacent to the second slit structure SL2. In an embodiment, the first supporter SP1 or the second supporter SP2 may penetrate the conductive layers C. The third supporter SP3 may penetrate the dummy region DM of the stack ST. The first supporter SP1, the second supporter SP2, or the third supporter SP3 may have a similar structure to the penetrating structure PS or the contact plug CT.

The first slit structure SL1 may cross the contact region CTR of the stack ST. The first slit structure SL1 may be used as a supporter during a manufacturing process. The first slit structure SL1 may include an insulating material such as oxide, nitride or air gap. Inside the first slit structure SL1, the stack ST may include third sacrificial layers instead of the conductive layers C. Furthermore, inside the first slit structure SL1, the contact plug penetrating the stack ST may be located.

The second slit structure SL2 may cross the stack ST, and may be extended in the first direction I. During the manufacturing process, a slit may be used as a passage for replacing the sacrificial layers in the stack ST with the conductive layers, and the second slit structure SL2 may be formed in the corresponding slit. The second slit structure SL2 may include a conductive material, an insulating material, or a combination thereof. In an embodiment, the second slit structure SL2 may include a source contact structure or an insulating spacer.

The second slit structure SL2 may be located in the cell region CR, and extended to the dummy region DM or the contact region CTR. The second slit structure SL2 may be located at the boundary between the cell region CR and the first plane edge region PE1, and extended along the boundary between the contact region CTR and the first plane edge region PE1 or the boundary between the dummy region DM and the first plane edge region PE1. The second slit structure SL2 may be located at the boundary between the cell region CR and the second plane edge region PE2, and extended along the boundary between the contact region CTR and the second plane edge region PE2 or the boundary between the dummy region DM and the second plane edge region PE2.

According to such a structure, the semiconductor device may include a plurality of memory blocks MB. The memory blocks MB may be located at the plane center region PC. A memory block adjacent to the first plane edge region PE1 or the second plane edge region PE2, among the memory blocks MB, may be a dummy memory block D_MB. The dummy memory block D_MB may have the same or similar structure as or to the memory block MB. The dummy memory block D_MB may store no data therein. Alternatively, the dummy memory block D_MB may be a redundancy memory block, and include redundancy memory cells for a repair operation.

Referring to FIG. 3C, the semiconductor device may further include one or more insulating structures IS, one or more dummy insulating structures D_IS, or a combination thereof.

The insulating structure IS may be located in the stack ST, and extended in the second direction II. In an embodiment, the insulating structure IS may be located in the contact region CTR, and extended to the first plane edge region PE1, extended to the second plane edge region PE2, or extended to the first plane edge region PE1 and the second plane edge region PE2.

The second slit structure SL2 may be extended in the first direction I, and cross the insulating structure IS or the dummy insulating structure D_IS. The second slit structure SL2 may cross the third portion P3 of the insulating structure IS, and may be spaced apart from the first portion P1 or the second portion P2. During a manufacturing process, the second slit structure SL2 may be formed after the insulating structure IS is formed. In an embodiment, a slit may be formed by etching the insulating structure IS and the stack ST, and then the second slit structure SL2 may be formed in the slit. In this case, when the slit overlaps the first curved edge CE1 or the second curved edge CE2, the overlapping portion may be formed with a relatively small width. Therefore, the second slit structure SL2 may be spaced apart from the first curved edge CE1 or the second curved edge CE2.

The dummy insulating structure D_IS may have a similar structure to the insulating structure IS. The dummy insulating structure D_IS may be located in the stack ST, and extended in the second direction II. The dummy insulating structure D_IS may be located in the dummy region DM, and extended to the first plane edge region PE1, extended to the second plane edge region PE2, or extended to the first plane edge region PE1 and the second plane edge region PE2. The dummy insulating structure D_IS may have a depth that penetrates the conductive layers C included in the stack ST. By forming the dummy insulating structure D_IS in the dummy region DM, in an embodiment, it is possible to minimize or prevent the formation of a bridge between the conductive layers C during the process of replacing the sacrificial layers included in the stack ST with the conductive layers C.

The contact plug CT may penetrate the stack ST or the insulating structure IS. The first slit structure SL1 may be located in the stack ST, and cross the insulating structure IS. The second slit structure SL2 may be located in the stack ST, and cross the insulating structure IS or the dummy insulating structure D_IS. The third supporters SP3 may penetrate the stack ST or the dummy insulating structure D_IS.

One or more first supporters SP1 of the first supporters SP1 may penetrate the first plane edge region PE1 of the stack ST. One or more first supporters SP1 of the first supporters SP1 may penetrate the third portion P3 of the insulating structure IS or the third portion P3 of the dummy insulating structure D_IS. For reference, the first supporters SP1 may also penetrate the first portion P1 of the insulating structure IS or the dummy insulating structure D_IS.

Similarly, one or more second supporters SP2 of the second supporters SP2 may penetrate the second plane edge region PE2 of the stack ST. One or more second supporters SP2 of the second supporters SP2 may penetrate the third portion P3 of the insulating structure IS or the third portion P3 of the dummy insulating structure D_IS. For reference, the second supporters SP2 may also penetrate the second portion P2 of the insulating structure IS or the dummy insulating structure D_IS.

The first plane edge region PE1 of the stack ST may include a first portion PE1_P1 and a second portion PE1_P2. The first portion PE1_P1 may be located closer to the edge of the plane than the second portion PE1_P2. In an embodiment, referring to FIG. 3B, the first portion PE1_P1 may include first sacrificial layers S1 and first insulating layers I1, which are alternately stacked. The second portion PE1_P2 may include conductive layers C and third insulating layers I3, which are alternately stacked.

The first plane edge region PE1 might not include a stair structure, or may include a stair structure in only a portion thereof, adjacent to the contact region CTR. In an embodiment, the first portion PE1_P1 of the first plane edge region PE1 might not include a stair structure, and the second portion PE1_P2 of the first plane edge region PE1 may include a stair structure.

The first portion P1 of the insulating structure IS may be located in the first portion PE1_P1 of the first plane edge region PE1. The third portion P3 of the insulating structure IS may be located in the second portion PE1_P2 of the first plane edge region PE1. The first supporters SP1 may penetrate the first portion PE1_P1, the second portion PE1_P2, or the third portion P3.

Similarly, the second plane edge region PE2 of the stack ST may include a first portion PE2_P1 and a second portion PE2_P2. The first portion PE2_P1 may be located closer to the plane edge than the second portion PE2_P2. In an embodiment, the first portion PE2_P1 may include second sacrificial layers S2 and second insulating layers I2, which are alternately stacked. The second portion PE2_P2 may include conductive layers C and third insulating layers I3, which are alternately stacked.

The second plane edge region PE2 might not include a stair structure, or may include a stair structure in only a portion thereof, adjacent to the contact region CTR. In an embodiment, the first portion PE2_P1 of the second plane edge region PE2 might not include a stair structure, and the second portion PE2_P2 of the second plane edge region PE2 may include a stair structure.

The second portion P2 of the insulating structure IS may be located in the first portion PE2_P1 of the second plane edge region PE2. The second supporters SP2 may penetrate the first portion PE2_P1, the second portion PE2_P2, or the third portion P3.

Figure 4A:
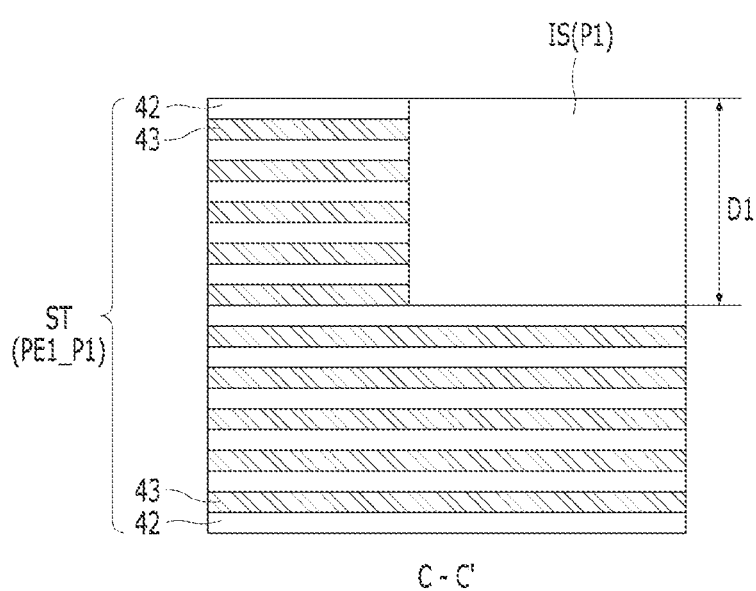
FIGS. 4A and 4B are diagrams illustrating the structure of the semiconductor device in accordance with the embodiment.
Figure 4B:
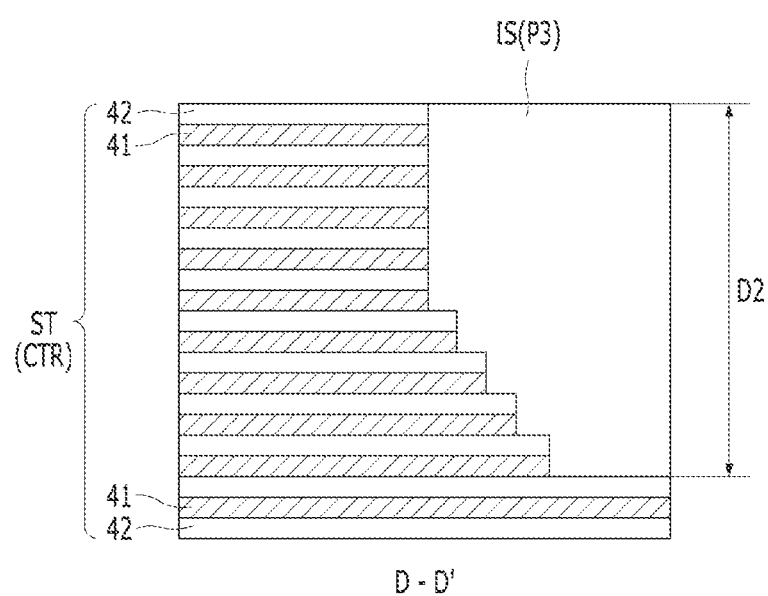

FIGS. 4A and 4B are diagrams illustrating the structure of the semiconductor device in accordance with the embodiment. FIG. 4A may be a cross-sectional view taken along line C-C' of FIG. 3C, and FIG. 4B is a cross-sectional view taken along line D-D' of FIG. 3C. Hereafter, contents overlapping the above-described contents will be omitted.

Referring to FIGS. 4A and 4B, the semiconductor device may include the stack ST and the insulating structure IS. The stack ST may include first material layers and second material layers, which are alternately stacked. The stack ST may have different layer structures depending on portions thereof.

Referring to FIG. 4A, the first portion PE1_P1 of the stack ST may include sacrificial layers 43 and insulating layers 42, which are alternately stacked. Referring to FIG. 4B, the contact region CTR of the stack ST may include conductive layers 41 and the insulating layers 42, which are alternately stacked. The conductive layers 41 may be word lines, bit lines, select lines or the like. The conductive layers 41 may include conductive materials such as polysilicon, tungsten, molybdenum, and metal. The insulating layers 42 may serve to insulate the stacked conductive layers 41 from each other. The insulating layers 42 may include oxide, nitride, air gap and the like.

The first portion P1 of the insulating structure IS may be located at a first depth D1 in the stack ST. The third portion P3 of the insulating structure IS may be located at a second depth D2 in the stack ST. The second depth D2 may be larger than the first depth D1.

The stack ST may include a stair structure in the contact region CTR. The bottom surface of the insulating structure IS may abut on the stair structure of the contact region CTR, and have a stair shape corresponding to the stair structure of the contact region CTR. The bottom surface of the first portion P1 may include no stair structure, or include a stair structure in only a portion thereof, adjacent to the contact region CTR. The bottom surface of the third portion P3 may include a stair structure.

The second portion P2 of the insulating structure IS may have a similar structure to the first portion P1. The second portion P2 may be located in the stack ST, while having a smaller depth than the third portion P3. The second portion P2 may include no stair structure, or include a stair structure in only a portion thereof, adjacent to the contact region CTR.

Figure 5:
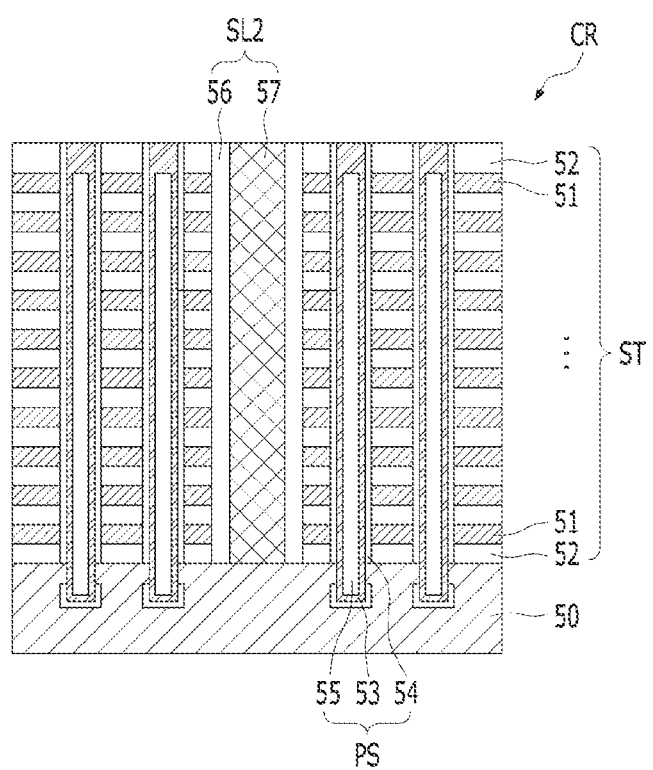
FIG. 5 is a diagram illustrating the structure of the semiconductor device in accordance with the embodiment.

FIG. 5 is a diagram illustrating the structure of the semiconductor device in accordance with the embodiment. FIG. 5 may be a cross-sectional view of the cell region CR of FIG. 3C. Hereafter, contents overlapping the above-described contents will be omitted.

Referring to FIG. 5, the semiconductor device may include the stack ST and the penetrating structure PS. The semiconductor device may further include the second slit structure SL2 or a base 50, or further include a combination thereof.

The stack ST may be located on the base 50. The base 50 may be a semiconductor substrate or a source structure including polysilicon or metal. The semiconductor substrate may include a source region.

The stack ST may include conductive layers 51 and insulating layers 52, which are alternately stacked. The penetrating structure PS may penetrate the stack ST, and may be extended to the base 50. Memory cells may be located at the respective intersections between the penetrating structure PS and the conductive layers 51. Along the penetrating structure PS, the memory cells may be stacked.

In an embodiment, the penetrating structure PS may be a channel structure. The channel structure may include a channel layer 53 penetrating the stack ST. The channel structure may further include a memory layer 54 covering the outer wall of the channel layer 53 or an insulating core 55 within the channel layer 53. The memory layer 54 may include a tunnelling layer, a data storage layer, or a blocking layer, or include a combination thereof. The channel structure may be connected to the source structure or the source region through the stack ST. In an embodiment, the channel layer 53 may be directly connected to the source structure, or connected to the source structure through a semiconductor pattern grown by an epitaxial method.

In an embodiment, the penetrating structure PS may be an electrode structure. The electrode structure may include an electrode layer penetrating the stack ST, and further include a memory layer covering the outer wall or inner wall of the electrode layer. The memory layer may include a variable resistance material.

The second slit structure SL2 may penetrate the stack ST, and may be extended to the base 50. The second slit structure SL2 may include a source contact structure 57 electrically coupled to the source structure and an insulating spacer 56 covering the sidewall of the source contact structure 57. The source contact structure 57 may include conductive materials such as polysilicon, tungsten, molybdenum, and metal. The source contact structure 57 may be electrically coupled to the source structure or the source region.

Figure 6A:
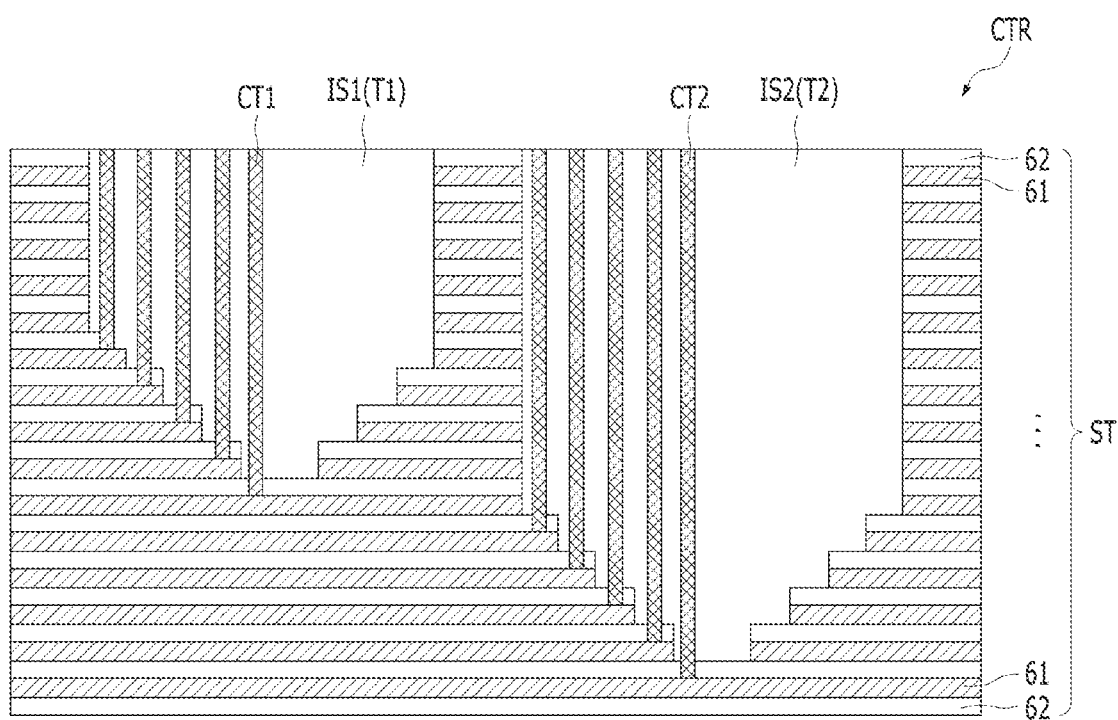
FIGS. 6A and 6B are diagrams illustrating the structure of the semiconductor device in accordance with the embodiment.
Figure 6B:
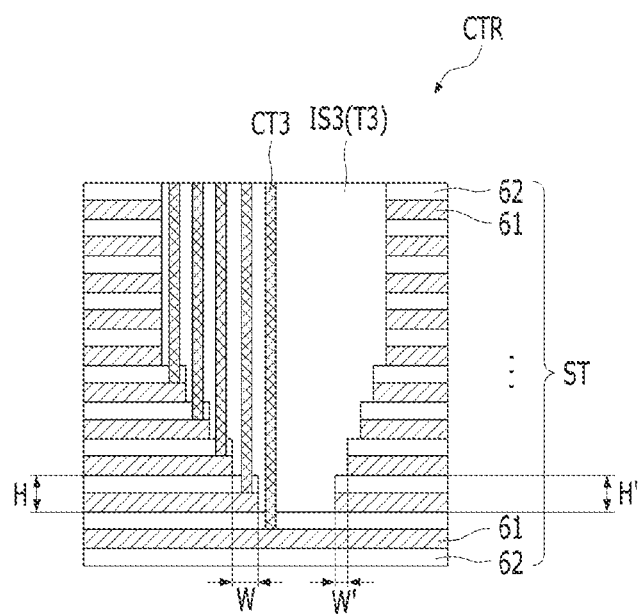

FIGS. 6A and 6B are diagrams illustrating the structure of the semiconductor device in accordance with the embodiment. FIGS. 6A and 6B may be cross-sectional views of the contact region CTR of FIG. 3C. Hereafter, contents overlapping the above-described contents will be omitted.

Referring to FIG. 6A, the semiconductor device may include the stack ST, a first insulating structure IS1, and a second insulating structure IS2. The semiconductor device may further include a first contact plug CT1 or a second contact plug CT2, or further include a combination thereof.

The stack ST may include conductive layers 61 and insulating layers 62, which are alternately stacked. A first trench T1 may penetrate a portion of the stack ST to a predetermined depth, and the first insulating structure IS1 may be located in the first trench T1. The first trench T1 may define a stair structure in the contact region CTR, and the conductive layers 61 may be exposed by the stair structure. The bottom surface of the first insulating structure IS1 may include a stair structure transferred from the stair structure of the contact region CTR. The first contact plugs CT1 may be connected to the respective conductive layers 61 through the first insulating structure IS1.

A second trench T2 may penetrate the stack ST to a different depth from the first trench T1. The second insulating structure IS2 may be located in the second trench T2.

The second trench T2 may define a stair structure in the contact region CTR, and the conductive layers 61 may be exposed by the stair structure. The stair structure of the first trench T1 and the stair structure of the second trench T2 may be located at different levels. The bottom surface of the second insulating structure IS2 may include a stair structure transferred from the stair structure of the contact region CTR. The stair structure of the second insulating structure IS2 and the stair structure of the first insulating structure IS1 may be located at different levels. The second contact plugs CT2 may be connected to the respective conductive layers 61 through the second insulating structure IS2.

FIG. 6A illustrates an embodiment in which the stair structure is bilaterally symmetrical, but the stair structure might not be bilaterally symmetrical. Referring to FIG. 6B, the left and right stair structures of a third trench T3 may have different shapes. The width W or height H of each step of the left stair structure may be different from the width W' or height H' of each step of the right stair structure. A third insulating structure IS3 may be located in the third trench T3. The bottom surface of the third insulating structure IS3 may include an asymmetrical stair structure transferred from the third trench T3. Third contact plugs CT3 may be connected to the respective conductive layers 61 through the third insulating structure IS3.

Figure 7A:
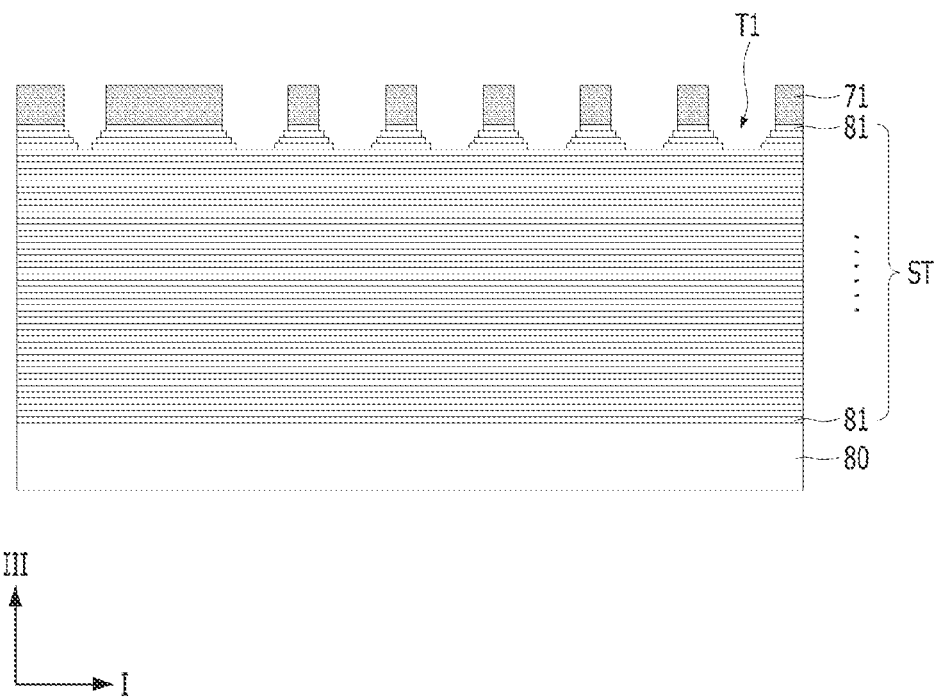
FIGS. 7A, 8A, 9A, 10A, and 11A and FIGS. 7B, 8B, 9B, 10B, and 11B are diagrams for describing a method for manufacturing a semiconductor device in accordance with an embodiment.
Figure 7B:
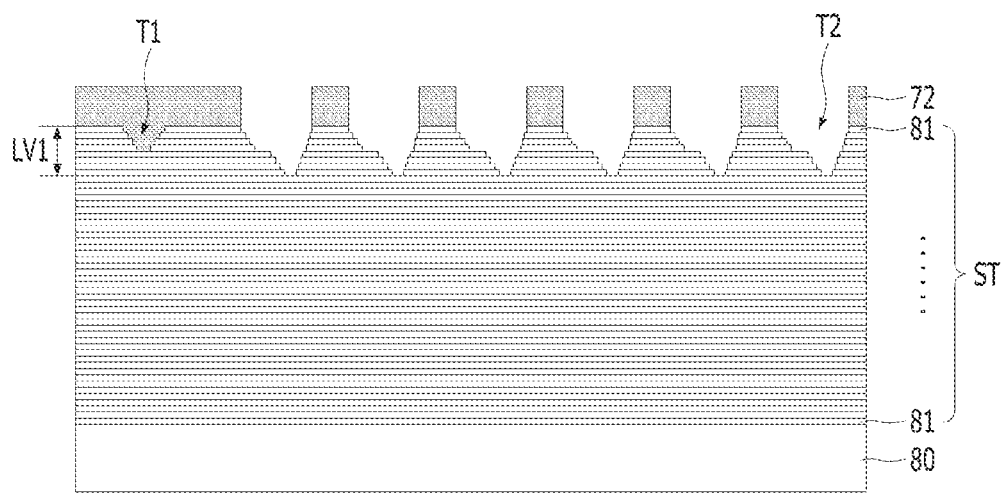

FIGS. 7A to 11A and FIGS. 7B to 11B are diagrams for describing a method for manufacturing a semiconductor device in accordance with an embodiment. FIGS. 7A and 7B may be cross-sectional views of a contact region. FIGS. 8A to 11A may be plan views, and FIGS. 9B to 11B may be cross-sectional views taken along lines E-E' of FIGS. 8A to 11A. Hereafter, contents overlapping the above-described contents will be omitted.

Referring to FIG. 7A, the stack ST may be formed on a base 80. The stack ST may include a contact region located between a first plane edge region and a second plane edge region. The stack ST may include layers 81 stacked in the third direction III. Each of the layers 81 may include one or more first material layers and one or more second material layers. The first material layer may include a conductive material or sacrificial material. The second material layer may include an insulating material.

Then, although not illustrated in the drawings, a penetrating structure penetrating the stack ST, a first slit structure, a supporter and the like may be formed. In an embodiment, a first slit may be formed through the stack ST, and then a first slit structure may be formed in the first slit.

Then, the first trenches T1 may be formed in the stack ST. The first trenches T1 may neighbor each other in the first direction I. In an embodiment, a first mask pattern 71 is formed on the stack ST, and then the stack ST is etched by using the first mask pattern 71 as an etch barrier. Subsequently, the first mask pattern 71 is reduced, and then the stack ST is etched. By repeatedly performing the process of reducing the first mask pattern 71 and etching the stack ST, the first trenches T1 may be formed. The first trenches T1 may define a stair structure extended in the first direction I within the stack ST. On the bottom surface of each of the first trenches T1, a pair of stair structures may be defined. The pair of stair structures may have a symmetrical shape. The first trenches T1 may have the same width or different widths. Subsequently, the first mask pattern 71 may be removed.

Referring to FIG. 7B, the second trenches T2 may be formed in the stack ST. In an embodiment, a second mask pattern 72 is formed on the stack ST. The second mask pattern 72 may include openings formed at positions corresponding to the first trenches T1. Subsequently, the stack ST is etched by using the second mask pattern 72 as an etch barrier. Furthermore, a process of reducing the second mask pattern 72 and then etching the stack ST is repeatedly performed. Through these processes, stair structures located at a first level LV1 may be formed. The second trenches T2 may have a shape formed by extending the first trenches T1 downward. Subsequently, the second mask pattern 72 may be removed.

For reference, on the bottom surface of each of the second trenches T2, a pair of stair structures may be defined. The pair of stair structures may have a symmetrical or asymmetrical shape. When the centers of the openings of the second mask pattern 72 and the centers of the first trenches T1 are aligned, the symmetrical stair structures may be formed. When the centers of the openings of the second mask pattern 72 and the centers of the first trenches T1 are misaligned, the asymmetrical stair structures may be formed. Furthermore, one or more first trenches T1 of the first trenches T1 might not be exposed to the openings, and maintain the shapes thereof as they are.

Figure 8A:
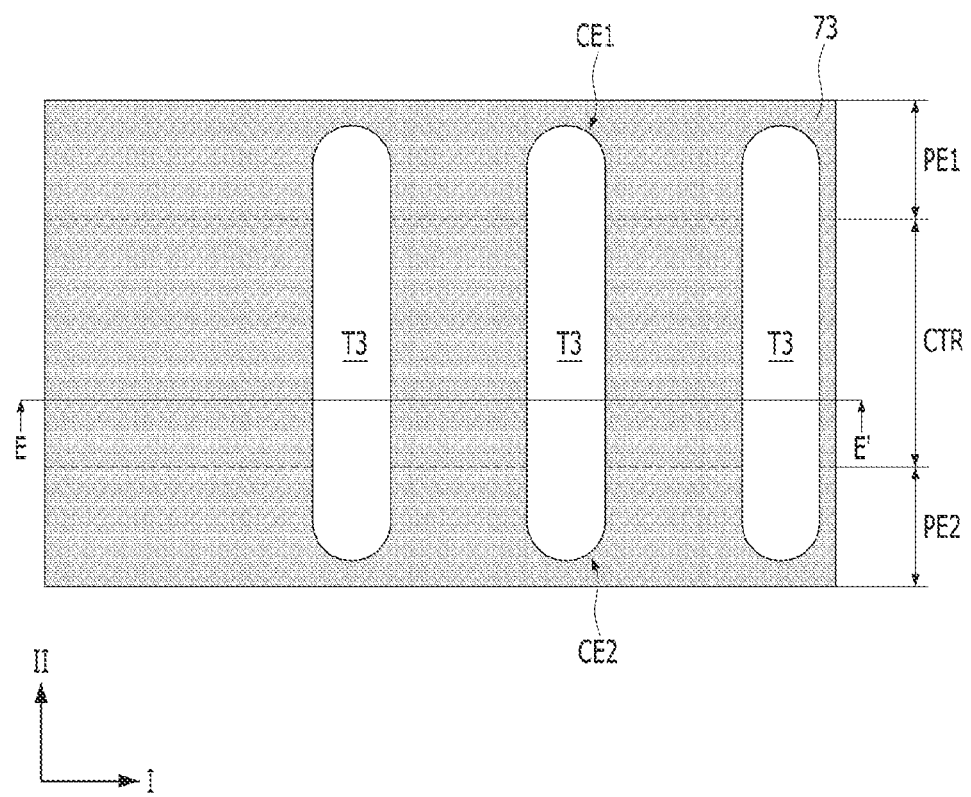
Figure 8B:
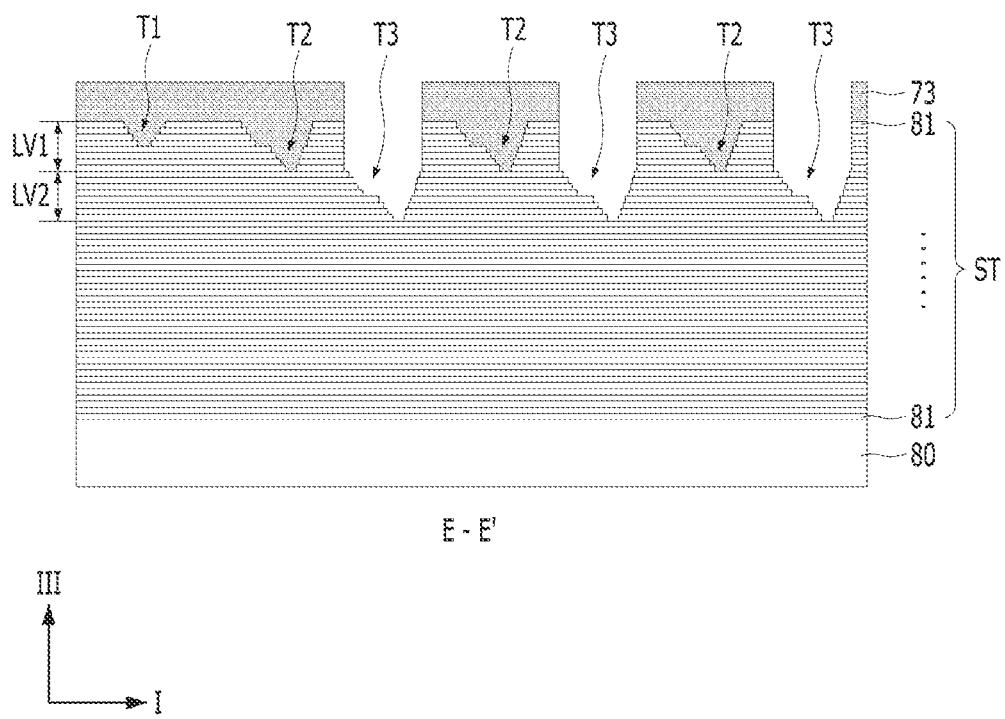

Referring to FIGS. 8A and 8B, a third mask pattern 73 may be formed on the stack ST. The third mask pattern 73 may include one or more openings that expose one or more second trenches T2 of the second trenches T2. Then, the third trenches T3 may be formed by etching the stack ST using the third mask pattern 73 as an etch barrier. The second trenches T2 may be extended downward to the depth by which the stack ST is etched, and the stair structures may be transferred downward. Through these processes, one or more stair structures located at a second level LV2 may be formed. Subsequently, the third mask pattern 73 may be removed.

The openings of the third mask pattern 73 may be located in the contact region CTR. The opening may be extended to the first plane edge region PE1, and include a first curved edge located in the first plane edge region PE1. The opening may be extended to the second plane edge region PE2, and include a second curved edge located in the second plane edge region PE2.

The third trench T3 may have a shape corresponding to the opening of the third mask pattern 73. The third trenches T3 may be located in the contact region CTR. The third trenches T3 may be extended to the first plane edge region PE1, and each include the first curved edge CE1 located in the first plane edge region PE1. The third trenches T3 may be extended to the second plane edge region PE2, and each include the second curved edge CE2 located in the second plane edge region PE2.

Figure 9A:
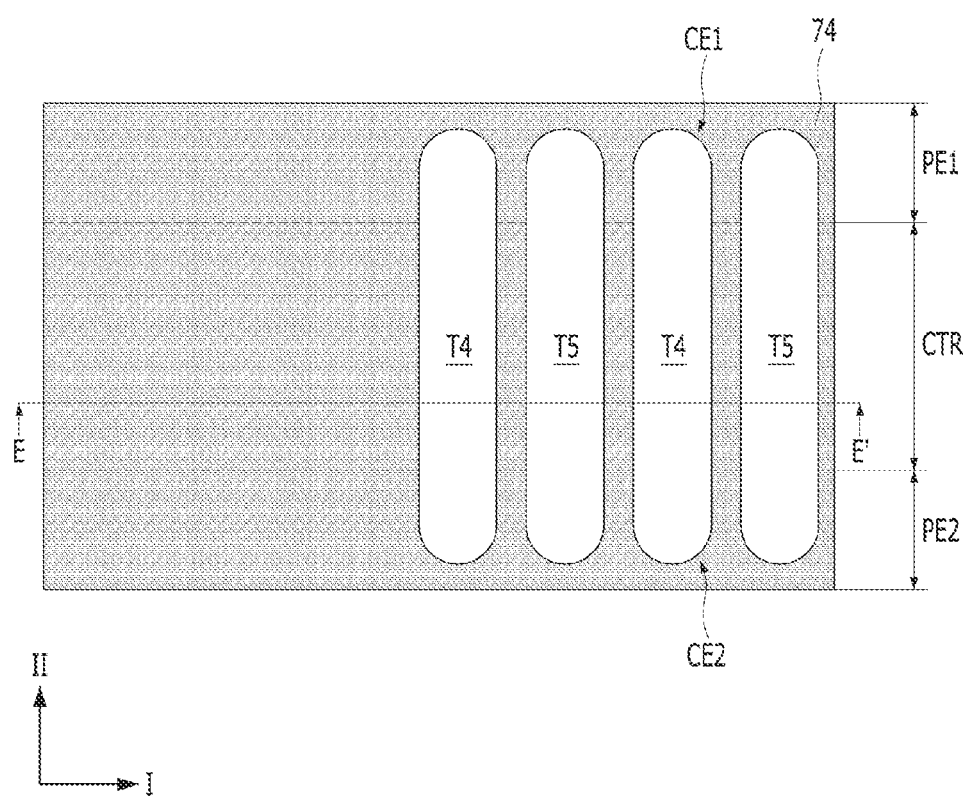
Figure 9B:
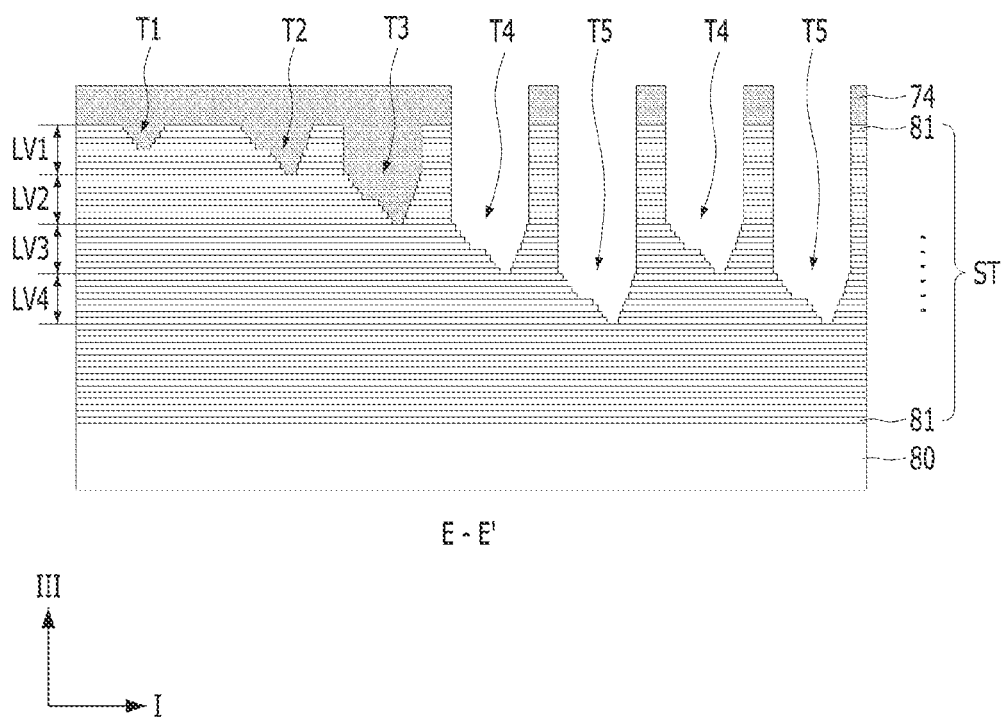

Referring to FIGS. 9A and 9B, a fourth mask pattern 74 may be formed on the stack ST. The fourth mask pattern 74 may include openings that expose one or more second trenches T2 and one or more third trenches T3. Then, fourth trenches T4 or fifth trenches T5 may be formed by etching the stack ST using the fourth mask pattern 74 as an etch barrier. The second trenches T2 may be extended downward to the depth by which the stack ST is etched, and the stair structures may be transferred downward. Through this process, stair structures located at a third level LV3 may be formed. Furthermore, the third trenches T3 may be extended downward to the depth by which the stack ST is etched, and the stair structures may be transferred downward. Through this process, stair structures located at a fourth level LV4 may be formed. Subsequently, the fourth mask pattern 74 may be removed.

The openings of the fourth mask pattern 74 may be located in the contact region CTR. The openings may be extended to the first plane edge region PE1, and each include a first curved edge located in the first plane edge region PE1. The openings may be extended to the second plane edge region PE2, and each include a second curved edge located in the second plane edge region PE2.

The fourth trench T4 or the fifth trench T5 may have a shape corresponding to the opening of the fourth mask pattern 74. The fourth trench T4 or the fifth trench T5 may be located in the contact region CTR, and extended to the first plane edge region PE1 or the second plane edge region PE2. The fourth trench T4 or the fifth trench T5 may include the first curved edge CE1 located in the first plane edge region PE1 or the second curved edge CE2 located in the second plane edge region PE2.

Figure 10A:
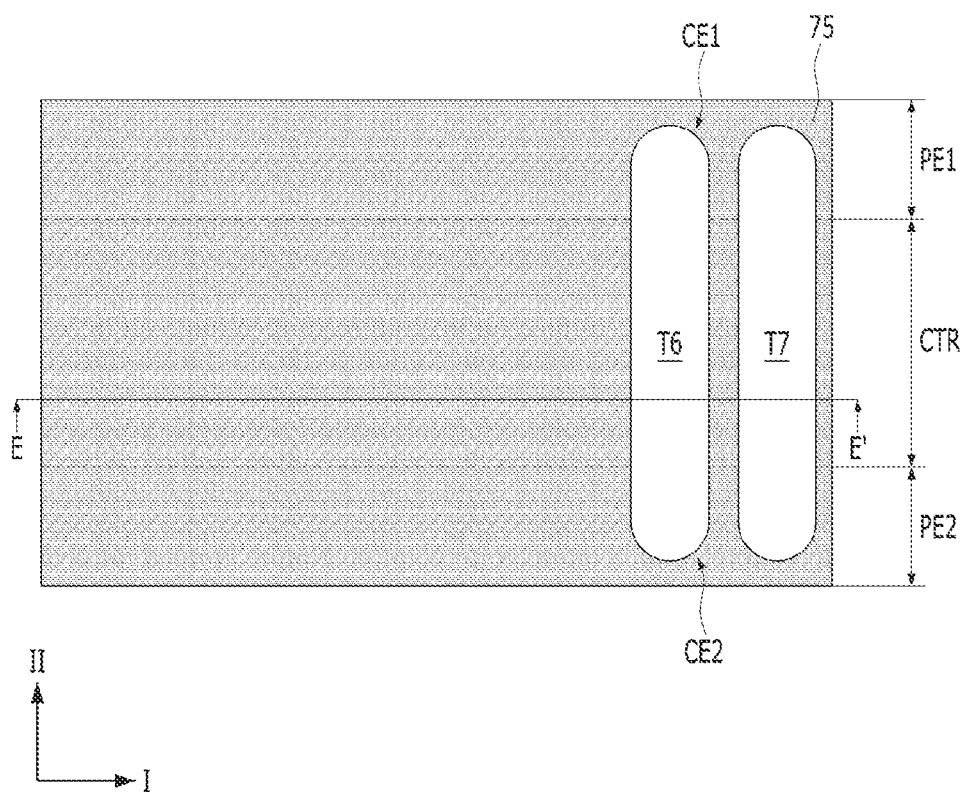
Figure 10B:
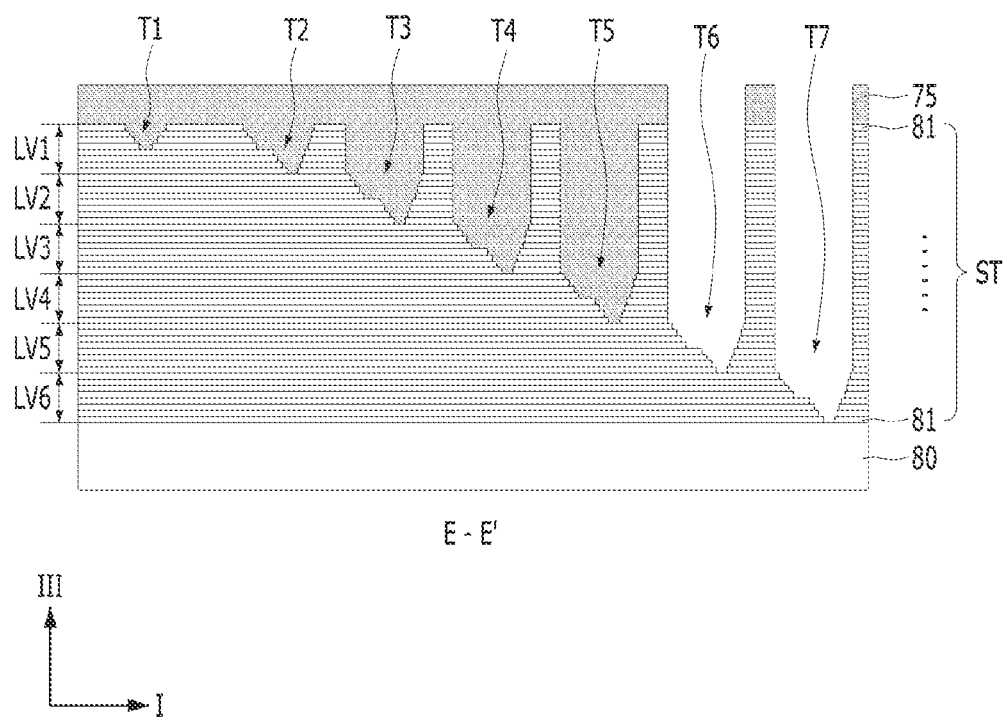

Referring to FIGS. 10A and 10B, the fifth mask pattern 75 may be formed on the stack ST. The fifth mask pattern 75 may include openings that expose one or more fourth trenches T4 and one or more fifth trenches T5. Then, a sixth trench T6 or a seventh trench T7 may be formed by etching the stack ST using the fifth mask pattern 75 as an etch barrier. The fourth trench T4 may be extended downward to the depth by which the stack ST is etched, and the stair structure may be transferred downward. Through this process, a stair structure located at a fifth level LV5 may be formed. Furthermore, the fifth trench T5 may be extended downward to the depth by which the stack ST is etched, and the stair structure may be transferred downward. Through this process, a stair structure located at a sixth level LV6 may be formed. Subsequently, the fifth mask pattern 75 may be removed.

The openings of the fifth mask pattern 75 may be located in the contact region CTR. The openings may be extended to the first plane edge region PE1, and each include the first curved edge located in the first plane edge region PE1. The openings may be extended to the second plane edge region PE2, and each include the second curved edge located in the second plane edge region PE2.

The sixth trench T6 or the seventh trench T7 may have a shape corresponding to the opening of the fifth mask pattern 75. The sixth trench T6 or the seventh trench T7 may be located in the contact region CTR, and extended to the first plane edge region PE1 or the second plane edge region PE2. The sixth trench T6 or the seventh trench T7 may include the first curved edge CE1 located in the first plane edge region PE1 or the second curved edge CE2 located in the second plane edge region PE2.

Figure 11A:
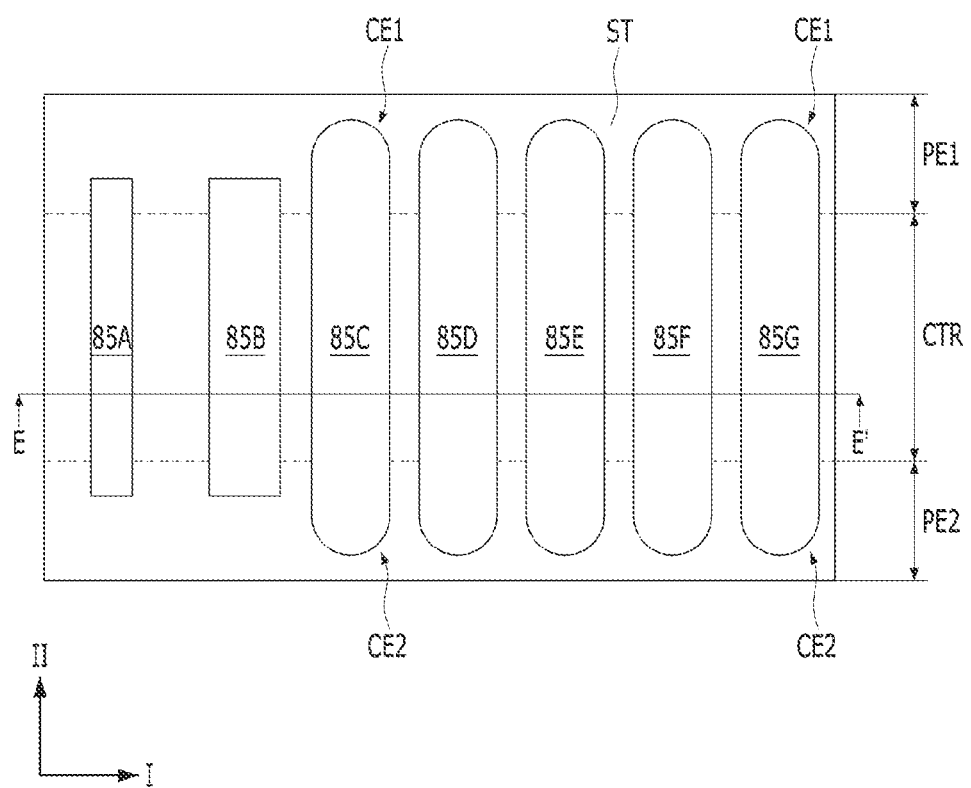
Figure 11B:
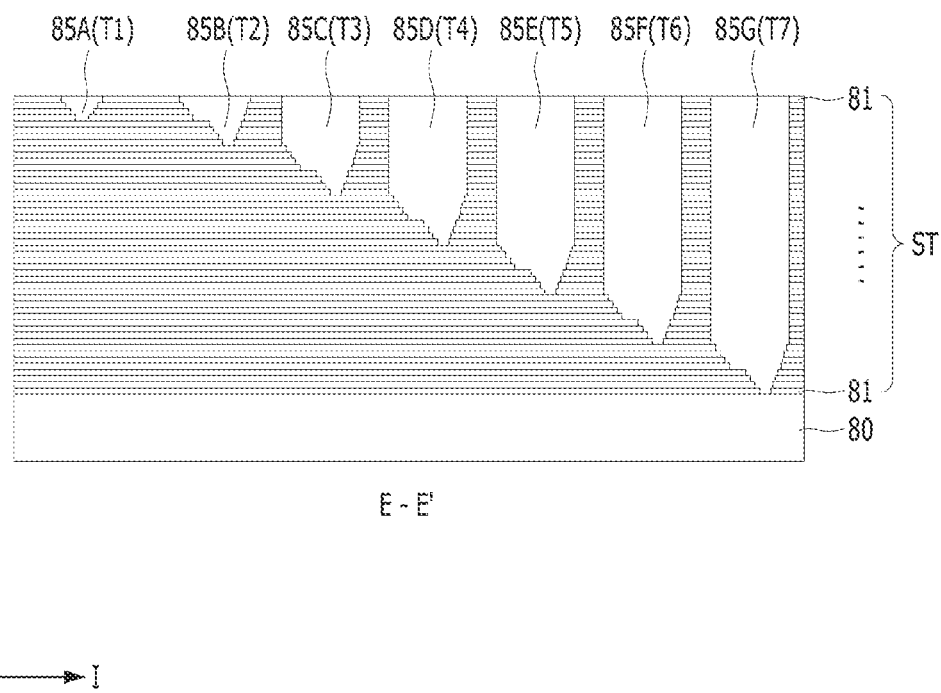

Referring to FIGS. 11A and 11B, the stack ST may include the first to seventh trenches T1 to T7. The first to seventh trenches T1 to T7 may have different depths from one another. Furthermore, the first to seventh trenches T1 to T7 may define stair structures located at different levels, respectively. Trenches having a relatively large aspect ratio among the first to seventh trenches T1 to T7 may each include the curved edge located in the first plane edge region PE1 or the second plane edge region PE2. In an embodiment, the third to seventh trenches T3 to T7 may each include the curved edge.

First to seventh insulating structures 85A to 85G may be formed in the first to seventh trenches T1 to T7, respectively. In an embodiment, an insulating layer is formed on the stack ST including the first to seventh trenches T1 to T7. In this case, the insulating layer may be formed by depositing an insulating material on the stack ST and then performing a heat treatment thereon. Then, the insulating layer may be planarized until the surface of the stack ST is exposed, in order to form the first to seventh insulating structures 85A to 85G. The insulating layer may include an insulating material such as oxide or nitride.

During the process of forming the first to seventh insulating structures 85A to 85G, the first to seventh trenches T1 to T7 may be abnormally filled with the insulating material depending on the shapes or depths thereof, or stress may be caused in a subsequent process. For example, an angled corner may be included in an end portion of the corresponding trench, or a rounded corner might not have a sufficient curvature. In this case, the insulating material may be abnormally deposited in the trench. When the heat treatment or the like is performed after the insulating material is deposited, in an embodiment, stress may be concentrated on the corner, and a crack may be formed in the insulating layer. In the third to seventh trenches T3 to T7 having a relatively large aspect ratio, in an embodiment, such a phenomenon is highly likely to occur. Therefore, the third to seventh trenches T3 to T7 having a relatively large aspect ratio may each include the curved edge in a plan view. When the third to seventh trenches T3 to T7 each include the curved edge, in an embodiment, the insulating material may be normally deposited. Furthermore, since stress is distributed by the curved edge, in an embodiment, it is possible to prevent or minimize the formation of a crack in the insulating layer.

On the plane defined in the first direction I and the second direction II, the first to seventh insulating structures 85A to 85G may each have a width in the first direction I, and have a length in the second direction II. The first to seventh insulating structures 85A to 85G may have substantially the same width or different widths. The first to seventh insulating structures 85A to 85G may have substantially the same length or different lengths. On a cross-section defined in the first and third directions I and III, the first to seventh insulating structures 85A to 85G may each have a height in the third direction III. The first to seventh insulating structures 85A to 85G may have substantially the same height or different heights. The bottom surfaces of the first to seventh insulating structures 85A to 85G may be located at different levels. The first to seventh insulating structures 85A to 85G may include the stair structures located at different levels, respectively.

Then, although not illustrated in the drawings, processes for forming a penetrating structure, a first slit structure, a second slit structure, a supporter, a contact plug and the like may be additionally performed. In an embodiment, a second slit may be formed through the stack, and then the first material layers may be replaced with conductive layers through the second slit. Then, the second slit structure may be formed in the second slit.

The number, depths, and stair structures of the trenches formed in the stack ST may be changed, if necessary. The trenches may be formed in the dummy region as well as the contact region. The trenches located in the dummy region may be formed with the trenches located in the contact region, or formed through separate processes.

Although various embodiments have been described for illustrative purposes, it will be apparent to those skilled in the art that various changes and modifications may be made without departing from the spirit and scope of the embodiments as defined in the following claims.

What is claimed is:
1. A semiconductor device comprising:
   a stack comprising a first plane edge region, a second plane edge region, and a contact region located between the first plane edge region and the second plane edge region; and a first insulating structure comprising a first portion located in the first plane edge region of the stack, a second portion located in the second plane edge region of the stack, and a third portion located in the contact region of the stack, wherein the first portion comprises a first curved edge.

2. The semiconductor device of claim 1, wherein the first curved edge is a portion of at least one of substantially a circle and substantially an ellipse.

3. The semiconductor device of claim 1, further comprising a slit structure crossing the third portion of the first insulating structure, and spaced apart from the first curved edge.

4. The semiconductor device of claim 3, wherein the slit structure comprises a source contact structure.

5. The semiconductor device of claim 1, further comprising a first supporter penetrating at least one of the first plane edge region of the stack and the first insulating structure.

6. The semiconductor device of claim 1, wherein the second portion of the first insulating structure comprises a second curved edge.

7. The semiconductor device of claim 6, further comprising a slit structure crossing the third portion of the first insulating structure, and spaced apart from the second curved edge.

8. The semiconductor device of claim 1, wherein a bottom surface of the third portion comprises a stair structure.

9. The semiconductor device of claim 1, wherein the first plane edge region of the stack comprises first sacrificial layers and first insulating layers, which are alternately stacked,
the second plane edge region of the stack comprises second sacrificial layers and second insulating layers, which are alternately stacked, and
the contact region of the stack comprises conductive layers and third insulating layers, which are alternately stacked.

10. The semiconductor device of claim 1, wherein the contact region of the stack comprises a stair structure.

11. The semiconductor device of claim 1, wherein the stack comprises a cell region located between the first plane edge region and the second plane edge region,
wherein the semiconductor device further comprises channel structures penetrating the cell region of the stack.

12. The semiconductor device of claim 1, further comprising contact plugs penetrating the insulating structure, and electrically coupled to the contact region of the stack.

13. The semiconductor device of claim 1, further comprising a second insulating structure located in the stack with a different depth from the first insulating structure, and comprising a curved edge in at least one of the first plane edge region and the second plane edge region.

14. The semiconductor device of claim 13, wherein, on a cross-section of the contact region, the first insulating structure comprises a stair structure located at a first level, and the second insulating structure comprises a stair structure located at a second level different from the first level.

15. A semiconductor device comprising:
a stack comprising a first plane edge region, a second plane edge region, and a contact region located between the first plane edge region and the second plane edge region; and
an insulating structure comprising a first portion located in the first plane edge region of the stack and having substantially a semicircular cylinder shape, a second portion located in the second plane edge region of the stack, and a third portion comprising a stair structure located in the contact region of the stack.

16. The semiconductor device of claim 15, further comprising a slit structure crossing the third portion of the insulating structure, and spaced apart from the first portion of the insulating structure.

17. The semiconductor device of claim 15, wherein the second portion of the insulating structure has substantially a semicircular cylinder shape.

18. The semiconductor device of claim 17, further comprising a slit structure penetrating the third portion of the insulating structure, and spaced apart from the second portion of the insulating structure.

* * * * *